(12) United States Patent
Ahn (10) Patent No.: US 8,367,925 B2
(45) Date of Patent: Feb. 5, 2013

(54) LIGHT-ELECTRICITY CONVERSION DEVICE

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 683 days.

(21) Appl. No.: 12/493,800

(22) Filed: Jun. 29, 2009

(65) Prior Publication Data

US 2010/0326489 A1   Dec. 30, 2010

(51) Int. Cl.
*H01L 31/00* (2006.01)

(52) U.S. Cl. .................. 136/260; 136/255; 136/264

(58) Field of Classification Search .......... 136/255, 136/260, 264
See application file for complete search history.

(56) References Cited

U.S. PATENT DOCUMENTS

| | | | |
|---|---|---|---|
| 3,920,860 A * | 11/1975 | Freller et al. | 438/479 |
| 3,990,096 A | 11/1976 | Namizaki et al. | |
| 4,764,261 A * | 8/1988 | Ondris et al. | 205/170 |
| 5,079,774 A | 1/1992 | Mendez et al. | |
| 5,112,410 A | 5/1992 | Chen | |
| 5,175,739 A | 12/1992 | Takeuchi et al. | |
| 5,181,219 A | 1/1993 | Mori et al. | |
| 5,181,221 A | 1/1993 | Mori et al. | |
| 5,182,757 A | 1/1993 | Mori et al. | |
| 5,287,377 A | 2/1994 | Fukuzawa et al. | |
| 5,291,507 A | 3/1994 | Haase et al. | |
| 5,295,148 A | 3/1994 | Mori et al. | |
| 5,317,584 A | 5/1994 | Mori et al. | |
| 5,404,027 A | 4/1995 | Haase et al. | |
| 5,404,369 A | 4/1995 | Mori et al. | |
| 5,490,953 A | 2/1996 | Morita | |
| 5,606,176 A | 2/1997 | Nitta | |
| 5,646,419 A | 7/1997 | McCaldin et al. | |
| 5,818,072 A | 10/1998 | Schetzina | |
| 5,933,444 A | 8/1999 | Molva et al. | |
| 6,069,380 A | 5/2000 | Chou et al. | |
| 6,515,313 B1 | 2/2003 | Ibbetson et al. | |
| 6,627,914 B1 | 9/2003 | Komiyama et al. | |
| 6,803,596 B2 | 10/2004 | Hata | |
| 6,813,063 B2 | 11/2004 | Ishihara | |
| 6,891,329 B2 | 5/2005 | Nagano et al. | |
| 7,420,225 B1 | 9/2008 | Wanke et al. | |
| 7,638,817 B2 | 12/2009 | Shur et al. | |
| 2002/0031153 A1 | 3/2002 | Niwa et al. | |
| 2002/0150135 A1 | 10/2002 | Naone et al. | |
| 2004/0058467 A1 | 3/2004 | Chirovsky et al. | |

(Continued)

FOREIGN PATENT DOCUMENTS

| | | | |
|---|---|---|---|
| JP | 07-202340 | * | 8/1995 |
| JP | 9199783 | | 7/1997 |

(Continued)

OTHER PUBLICATIONS

Compaan et al. "Sputtered II-VI alloys and structures for tandem PV", subcontract report NREL/SR-520-43954, Sep. 2008.*

(Continued)

*Primary Examiner* — Mark F Huff
*Assistant Examiner* — Allison Bourke
(74) *Attorney, Agent, or Firm* — Workman Nydegger (57) ABSTRACT

Light-electricity conversion devices based on II-VI semiconductor materials are provided. The light-electricity conversion devices are able to cover a wide spectrum range.

28 Claims, 2 Drawing Sheets

U.S. PATENT DOCUMENTS

| | | | |
|---|---|---|---|
| 2004/0095978 A1 | 5/2004 | Cheng et al. | |
| 2004/0183087 A1 | 9/2004 | Gardner | |
| 2004/0232412 A1 | 11/2004 | Burgener et al. | |
| 2005/0074576 A1 | 4/2005 | Chaiken et al. | |
| 2005/0185686 A1 | 8/2005 | Rupasov et al. | |
| 2005/0285128 A1 | 12/2005 | Scherer et al. | |
| 2006/0244003 A1 | 11/2006 | Ueda | |
| 2007/0063304 A1 | 3/2007 | Matsumoto et al. | |
| 2007/0126021 A1 | 6/2007 | Ryu et al. | |
| 2007/0126037 A1 | 6/2007 | Ikeda | |
| 2007/0194297 A1 | 8/2007 | McCarthy et al. | |
| 2007/0298551 A1 | 12/2007 | Bouvet et al. | |
| 2008/0048193 A1 | 2/2008 | Yoo et al. | |
| 2008/0197366 A1 | 8/2008 | Yoo et al. | |
| 2009/0017268 A1 | 1/2009 | Skipor et al. | |
| 2009/0020149 A1* | 1/2009 | Woods et al. | 136/244 |
| 2009/0114940 A1 | 5/2009 | Yang et al. | |
| 2009/0121628 A1 | 5/2009 | Cho et al. | |
| 2009/0220017 A1 | 9/2009 | Kawamura | |
| 2009/0273820 A1 | 11/2009 | Dionne et al. | |
| 2009/0310640 A1 | 12/2009 | Sato et al. | |
| 2010/0096001 A1* | 4/2010 | Sivananthan et al. | 136/249 |
| 2010/0155696 A1 | 6/2010 | Duan et al. | |
| 2010/0261338 A1 | 10/2010 | Tsakalakos et al. | |
| 2010/0276661 A1 | 11/2010 | Ahn | |
| 2010/0301308 A1 | 12/2010 | Ahn | |
| 2010/0301454 A1* | 12/2010 | Zhang et al. | 257/614 |
| 2010/0326489 A1 | 12/2010 | Ahn | |
| 2011/0001121 A1 | 1/2011 | Ahn | |
| 2011/0001122 A1 | 1/2011 | Ahn | |
| 2011/0001124 A1 | 1/2011 | Ahn | |
| 2011/0001125 A1 | 1/2011 | Ahn | |
| 2011/0043884 A1 | 2/2011 | Ahn | |
| 2011/0095309 A1 | 4/2011 | Ahn | |
| 2011/0114995 A1 | 5/2011 | Ahn | |
| 2012/0040483 A1 | 2/2012 | Ahn | |

FOREIGN PATENT DOCUMENTS

| | | | |
|---|---|---|---|
| WO | WO2009067347 | * | 5/2009 |
| WO | 2009106583 | | 9/2009 |
| WO | 2010137865 | | 12/2010 |
| WO | 2011004990 | | 1/2011 |

OTHER PUBLICATIONS

Machine translation of JP07-202340, pub. Aug. 1995.*

Seoung-Hwan Park, et al "Crystal-orientation effects on the piezoelectric field and electronic properties of strained wurtzite semiconductors" Physical Review B, vol. 59, No. 7, Feb. 15, 1999-I, pp. 4725-4737.

Doyeol Ahn "Time-convolutionless reduced-desnsity-operator theory of an arbitrary driven system coupled to a stochastic reservoir. II. Optical gain and line-shape function of a driven semiconductor" Physical Review B, vol. 51, No. 4, Jan. 15, 1995-II, pp. 2150-2166.

Doyeol Ahn "Time-convolutionless reduced-desnsity-operator theory of an arbitrary driven system coupled to a stochastic reservoir: Quantum kinetic equations for semiconductors" Physical Review B, vol. 50, No. 12, Sep. 15, 1994-II, pp. 8310-8318.

D. Ahn, et al "Electric field dependence of instrasubband polar-optical-phonon scattering in a quantum well" Physical Review B, vol. 37, No. 5, Feb. 15, 1988-I, pp. 2529-2535.

P.I. Kuznetsov, et al "Hexagonal ZnCdS epilayers and CdSSE/ZnCdS QW structures on CdS(0001) and ZnCdS (0001) substrates grown by MOVPE" Physica E 17 (2003), pp. 516-517.

P. Waltereit, et al "Nitride semiconductors free of electrostatic fields for efficient white light-emitting diodes" Letters to Nature, vol. 206, Aug. 24, 2000, pp. 865-868.

Seoung-Hwan Park "Crystal Orientation Effects on Electronic Properties of Wurtzite GaN/AlGaN Quantum Wells with Spontaneous and Piezoelectric Polarization" Jpn. J. Appl. Phys. vol. 39 (2000), pp. 3478-3482.

Tsung-Hsing Yu, et al "Theoretical study of the two-dimensional electron mobility in strained III-nitride heterostructures" Journal of Applied Physics, vol. 89, No. 7, Apr. 1, 2001, pp. 3827-3834.

Yifei Zhang, et al "Charge control and mobility studies for an AiGan/GaN high electron mobility transistor" Journal of Applied Physics, vol. 85, No. 1, Jan. 1, 1999, pp. 587-594.

J. Ueno, et al "MBE growth of ZnSe/MgCdS and ZnCdS/MgCdS superlatttices for UV-A sensors" Phys. Stat. Sol. (c) 3, No. 4, (2006), pp. 1225-1228.

Doyeol Ahn, et al "Non-Markovian Gain of Strained-Layer Wurtzite GaN Quantum-Well Lasers with Many-Body Effects" IEEE Journal of Selected Topics in Quantum Electronics, vol. 4, No. 3, May/Jun. 1998, pp. 520-526.

D. Ahn, et al "Optical Gain and Luminescence of a ZnO-MgZnO Quantum Well" IEEE Photonics Technology Letters, vol. 18, No. 2, Jan. 15, 2006, pp. 349-351.

Doyeol Ahn "Theory of Non-Markovian Gain in Strained-Layer Quantum-Well Lasers with Many-Body Effects" IEEE Journal of Quantum Electronics, vol. 34, No. 2, Feb. 1998, pp. 344-352.

Jie Liu, et al "AlGaN/GaN/InGaN/GaN DH-HEMTs With an InGaN Notch for Enhanced Carrier Confinement" IEEE Electron Device Letters, vol. 27, No. 1, Jan. 2006, pp. 10-12.

I.V. Bradley, et al "Space-charge effects in type-II strained layer superlattices" Journal of Crystal Growth 184/185 (1998), pp. 728-731.

Seoung-Hwan Park, et al "Optical gain in InGaN/InGaAlN quantum well structures with zero internal field" Applied Physics Letters 92, 171115 (2008).

Seoung-Hwan Park, et al "Spontaneous and piezoelectric polarization effects in wurtzite ZnO/MgZnO quantum well lasers" Applied Physics Letters 87, 253509 (2005).

Seoung-Hwan Park, et al "Many-body optical gain and intraband relaxation time of wurtzite InGaN/GaN quantum-well lasers and comparison with experiment" Applied Physics Letters 87, 044103 (2005).

Seoung-Hwan Park, et al "Piezoelectric effects on electrical and optical properties of wurtzite GaN/AlGaN quantum well lasers" Applied Physics Letters vol. 72, No. 24, Jun. 15, 1998, pp. 3103-3105.

Seoung-Hwan Park, et al "Many-body optical gain of wurtzite GaN-based quantum-well lasers and comparison with experiment" Appl. Phys. Lett. 72 (3), Jan. 19, 1998, pp. 287-289.

A. Jia, et al "Design of new UV/blue/green light emitters made of hexagonal-phase ZnMgCdOSSe mixed-crystal system fabricated on GaAs- and InP-(1 1 1) substrates" Journal of Crystal Growth 214/215 (2000) pp. 1085-1090.

Australian Patent Office; International Search Report and Written Opinion in corresponding PCT application (PCT/KR2010/007292); mailed Jan. 26, 2011.

Park, S.-H., et al., "Internal field engineering in CdZnO/MgZnO quantum well structures," Applied Physics Letters, vol. 94, Issue:8, pp. 083507, 1-3 (2009).

U.S. Appl. No. 12/472,168, filed Jun. 18, 2010, Office Action.
U.S. Appl. No. 13/485,241, filed May 31, 2012, Ahn.
U.S. Appl. No. 12/472,168, Jul. 21, 2010, Office Action.
U.S. Appl. No. 12/472,168, Jan. 5, 2011, Office Action.
U.S. Appl. No. 12/472,168, Feb. 22, 2011, Notice of Allowance.
U.S. Appl. No. 12/472,168, Aug. 18, 2011, Notice of Allowance.
U.S. Appl. No. 12/472,168, Sep. 1, 2011, Notice of Allowance.
U.S. Appl. No. 12/472,168, Mar. 29, 2012, Notice of Allowance.
U.S. Appl. No. 12/472,168, May 29, 2012, Notice of Allowance.
U.S. Appl. No. 12/498,265, May 17, 2011, Office Action.
U.S. Appl. No. 12/498,265, Aug. 26, 2011, Office Action.
U.S. Appl. No. 12/498,265, Feb. 28, 2012, Office Action.
U.S. Appl. No. 12/498,265, Aug. 17, 2012, Office Action.
U.S. Appl. No. 12/498,228, Sep. 1, 2010, Office Action.
U.S. Appl. No. 12/498,228, Dec. 23, 2010, Office Action.
U.S. Appl. No. 12/498,228, Jul. 12, 2011, Office Action.
U.S. Appl. No. 12/498,228, Dec. 15, 2011, Notice of Allowance.
U.S. Appl. No. 12/498,204, Apr. 26, 2011, Office Action.
U.S. Appl. No. 12/498,204, Jul. 21, 2011, Notice of Allowance.
U.S. Appl. No. 12/498,204, Jul. 28, 2011, Notice of Allowance.
U.S. Appl. No. 12/498,204, Oct. 25, 2011, Notice of Allowance.
U.S. Appl. No. 12/498,204, Feb. 1, 2012, Office Action.
U.S. Appl. No. 12/498,204, Mar. 26, 2012, Notice of Allowance.
U.S. Appl. No. 12/498,204, May 29, 2012, Notice of Allowance.

U.S. Appl. No. 12/498,204, Jul. 4, 2012, Issue Notification.
U.S. Appl. No. 12/498,257, Nov. 23, 2011, Office Action.
U.S. Appl. No. 12/498,257, Jul. 3, 2012, Office Action.
U.S. Appl. No. 12/545,678, Dec. 16, 2011, Office Action.
U.S. Appl. No. 12/545,678, Jun. 20, 2012, Notice of Allowance.
U.S. Appl. No. 12/606,880, Apr. 29, 2011, Office Action.
U.S. Appl. No. 12/606,880, Aug. 15, 2011, Notice of Allowance.
U.S. Appl. No. 12/606,880, Nov. 17, 2011, Notice of Allowance.
U.S. Appl. No. 12/606,880, Feb. 16, 2012, Notice of Allowance.
U.S. Appl. No. 12/606,880, May 23, 2012, Notice of Allowance.
U.S. Appl. No. 12/606,880, Aug. 31, 2012, Notice of Allowance.
"II-VI solar cells moving to the production phase," Photovoltaics Bulletin., (2003), vol. 2003, No. 11, Oct. 2003, pp. 10-12.
Ahn, D., and Chuang, S. L., "A field-effect quantum-well laser with lateral current injection,", J.Appl. Phys. 64(1), Jul. 1, 1988, 440-442.
Alda, J., et al., "Optical antennas for nano-photonic applications," Nanotechnology, TNT 2004, Trends in Nanotechnology, vol. 16, No. 5.
Andreani, L. C., et al., "Exchange interaction and polariton effects in quantum-well excitons," Physical Review B, vol. 41, No. 11, pp. 7536-7544 (1990).
Angelakis, D. G., et al., "Photon-blockade-induced Mott transitions and XY spin models in coupled cavity arrays," Phys. Rev. A76, 031805 (2007), pp. 4.
Bai, S., et al., "Determination of the electric field in 4H/3C/4H-SiC quantum wells due to spontaneous polarization in the 4H SiC matrix," Applied Physics Letters, Oct. 13, 2003, vol. 83, No. 15, pp. 3171-3173.
Bozhevolnyi, S. I., et al "Channel Plasmon-Polariton Guiding by Subwavelength Metal Grooves" Physical Review Letters, vol. 95, 046802, Jul. 22, 2005, pp. 046802-1-046802-4.
Chu, T.L., and Chu, S.S., "Thin film II-VI photovoltaics," vol. 38, Issue 3, Mar. 1995, pp. 533-549.
Gogolin, O., et al., Temperature dependence of exciton peak energies in Cui quantum dots, Solid State Communications, vol. 122, pp. 511-513 (2002).
Goosen, K.W., "Excitonic electroabsorption in extremely shallow quantum wells," Appl. Phys. Lett., vol. 57, Issue 24, pp. 2582-2584, 1990.
Greentree, A.D., et al., "Quantum phase transitions of light," Nature Physics 2, pp. 856-861 (2006).
Hartmann, M.J., and Plenio, M.B., "Strong Photon Nonlinearities and Photonic Mott Insulators," Physical Review Letters, vol. 99, Issue 10, Sep. 7, 2007, pp. 103601-1 to 103601-4.
Hernández, F. E. et al., "High Performance Optical Limiter," accessed at http://web.archive.org/web/20050429144449/http://www.ieee.org/organizations/pubs/newsletters/leos/dec00/high.htm, accessed on May 7, 2012, pp. 5.
Hetterich, J., et al., "Optimized Design of Plasmonic MSM Photodetector," IEEE Journal of Quantum Electronics, Oct. 2007, vol. 43, No. 10, pp. 855 to 859.
Hoang, T. et al., "A High Efficiency Lateral Light Emitting Device on SOI," Electron Devices for Microwave and Optoelectronic Applications, EDMO 2004, 12th International Symposium, Nov. 8-9, 2004, pp. 87-91.
Huh, C., et al., "Improvement in light-output efficiency of InGaN/GaN multiple-quantum well light-emitting diodes by current blocking layer," Journal of Appl. Phys., vol. 92, No. 5, 2002, 2248-2250.
Jeon, S. -R et al "GaN tunnel junction as a current aperture in a blue surface-emitting light-emitting diode," Applied Physics Letters, vol. 80, No. 11, Mar. 18, 2002, 1933-1935.
Jeon S. -R., et al., "Lateral current spreading in GaN-based light-emitting diodes utilizing tunnel contact junctions," Applied Physics Letters, vol. 78, No. 21, May 21, 2001, 3265-3267.
Jin, S. X., et al., "Size dependence of III-nitride microdisk light-emitting diode characteristics," Applied Physics Letters, May 28, 2001, vol. 78, No. 22, pp. 3532-3534.
Kawazoe, T., and Masumoto, Y., "Luminescence Hole Burning and Quantum Size Effects of Charged Excitons in CuCl Quantum Dots," Physical Review Letters, vol. 77, Issue 24, pp. 4942-4945 (1996).
Kim, H., et al., "Lateral current transport path, a model for GaN-based light-emitting diodes: application to practical device designs," Appl. Phys. Lett., vol. 81, No. 7, Aug. 12, 2002, 1326-1328.

Klimov, V.I., et al., "Optical Gain and Stimulated Emission in Nanocrystal Quantum Dots," Science, Oct. 13, 2000, vol. 290, No. 5490, pp. 314-317.
LEDs Magazine, "Goldeneye sets brightness benchmark for green LEDs," accessed at http://web.archive.org/web/20090221093013/http://www.ledsmagazine.com/news/5/5/18, May 15, 2008, pp. 1.
Leosson, K., et al., "Long-range surface plasmon polariton nanowire waveguides for device applications," Optics Express, vol. 14, No. 1, Jan. 9, 2006 pp. 314-319.
Little, R. B., et al., "Formation of quantum-dot quantum-well heteronanostructures with large lattice mismatch: ZnS/CdS/ZnS," Journal of Chemical Physics, vol. 114, No. 4, 2001, pp. 1813-1822.
Liu, L., et al., "Novel surface plasmon waveguide for high integration," Optics Express, vol. 13, No. 17, Aug. 22, 2005, pp. 6645-6650.
Masumoto, Y., et al., "Observation of persistent spectral hole burning in CuBr quantum dots," Physical Review B, vol. 52, No. 7, pp. 4688-4691 (1995).
Najeh, A.-S., et al., "Synthesis of CdSeS Nanocrystals in Coordinating and Noncoordinating Solvents: Solvent's Role in Evolution of the Optical and Structural Properties," Mar. 26, 2007, Vol. 19, pp. 5185-5193.
Neogi, A., et al., "Enhancement of spontaneous recombination rate in a quantum well by resonant surface plasmon coupling," Physical Review B, vol. 66 (2002) pp. 153305-1-153305-4.
Obloh, H., "Group III-nitride based blue emitters," Advances in Solid State Physics, vol. 38, 15-28 (1999).
Okamoto, K., et al., "Surface-plasmon-enhanced light emitters based on InGaN quantum wells," Nature Materials, vol. 3, Sep. 2004, pp. 601-605.
Paschotta, R., "Encyclopedia of Laser Physics and Technology," vol. 1 WileyVCH, 2008, ISBN 3527408282, 9783527408283 p. 595.
Ricker, T., "Samsung's "world's smallest" 8.4 megapixel CMOS sensor: so long CCD?," accessed at http://www.engadget.com/2007/03/27/samsungs-worlds-smallest-8-4-megapixel-cmos-sensor-so-long/, Mar. 27, 2007, pp. 4.
Sargent, E.H., et al, "Lateral Injection Lasers," International Journal of High Speed Electronics and Systems, Dec. 1998, vol. 9, No. 4, pp: 941-978.
Shakya, J., et al., "Switching characteristics of III-Nitride blue/green micro-LEDs," The Smithsonian/NASA Astrophysics Data System, American Physical Society, Annual March Meeting, Mar. 12-16, 2001.
Siliconfareast.com., "Lattice Constants," accessed at http://web.archive.org/web/20090308085832/http://www.siliconfareast.com/lattice_constants.htm, pp. 2, retrieved May 15, 2011.
Smith, S. J., et al., "Lateral light emitting n-i-p. diodes in InSb/AlxIn1-xSb quantum wells," Applied Physics Letters, vol. 89, p. 111118 (2006), 3 pages.
Sumith, B., et al., "Quantum Well Infrared Photodetectors for Long Wavelength Infrared Applications," Proceedings of SPIE, Oct. 1998, vol. 3436, Infrared Technology and Applications XXIV, pp. 280 to 284.
Tassone, F., and Bassani, F., "Quantum-well reflectivity and exciton-polariton dispersion," Physical Review B, vol. 45, No. 11, pp. 6023-6030 (1992).
Tauchi, T., et al., "Ultraviolet Laser and Photodetector of CdZnS/ZnS Multiple Quantum Wells," Physica B. 1993, vol. 191, pp. 136-139.
Ullrich, B., and Schroeder, R., "Green emission and bandgap narrowing due to two-photon excitation in thin film CdS formed by spray pyrolysis," Semiconductor Science and Technology, 2001.
Valenta, J., et al., "Hole-filling of persistent spectral holes in the excitonic absorption band of CuBr quantum dots," Applied Physics Letters, vol. 70, No. 6, pp. 680-682 (1997).
Wikipedia., "Wurtzite crystal structure," accessed at http://en.wikipedia.org/wiki/Wurtzit_crystal_structure; p. 1, Jan. 24, 2012.
Williams, R.S., et al., "Growth and luminescence spectroscopy of a CuCl quantum well structure," Journal of Vacuum Science and Technology A: Vaccum, Surfaces and Films, vol. 6, No. 3, pp. 1950-1952 (1988).

Yeh, D-M., et al., "Surface plasmon coupling effect in an InGaN/GaN single-quantumwell light-emitting diode," Applied Physics Letters, Oct. 23, 2007, vol. 91, pp. 171103-1 to 171103-3.

Yu, E. T., et al., "Plasmonic Nanoparticle Scattering for Enhanced Performance of Photovoltaic and Photodetector Devices," Proceedings of SPIE, Aug. 28, 2008, vol. 7033, Plasmonics: Nanoimaging, Nanofabrication and their Applications IV, pp. 70331V-1 to 70331V-9.

International Search Report and Written Opinion for International Application No. PCT/KR2010/002649 mailed on Jul. 26, 2010.

International Search Report and Written Opinion for International Application No. PCT/KR2010/003322 mailed on Aug. 10, 2010.

International Search Report and Written Opinion for International Application No. PCT/KR2010/004350 mailed on Sep. 10, 2010.

International Search Report and Written Opinion for International Application No. PCT/KR2010/005600 mailed on Oct. 22, 2010.

International Search Report and Written Opinion for International Application No. PCT/KR2010/007292 mailed on Jan. 26, 2011.

International Search Report and Written Opinion for International Application No. PCT/KR2010/008118 mailed on Feb. 11, 2011.

* cited by examiner

LIGHT-ELECTRICITY CONVERSION DEVICE

TECHNICAL FIELD

The described technology generally relates to light-electricity conversion devices and, more particularly, to light-electricity conversion devices based on II-VI semiconductor materials.

BACKGROUND

Photovoltaic cell technology is actively being researched as a source of energy. A photovoltaic cell is a light to electricity (hereinafter, referred to as "light-electricity") conversion device that converts a light source (e.g., sunlight) directly into electricity by using electromotive force generated by diffusion of minority carriers in a semiconductor excited by solar irradiation.

One drawback to present photovoltaic cells is their poor electrical performance. For example, silicon (Si)-based photovoltaic cells exhibit excessive light loss due to the cells' narrow light absorption band, which results in less than 30% theoretical light energy conversion efficiency.

SUMMARY

In one embodiment, a light-electricity conversion device that converts absorbed radiation to electricity includes a substrate and a cell that absorbs radiation disposed on a surface of the substrate, wherein the cell includes at least one II-VI semiconductor compound.

The foregoing summary is illustrative only and is not intended to be in any way limiting. In addition to the illustrative aspects, embodiments and features described above, further aspects, embodiments and features will become apparent by reference to the drawings and the following detailed description.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Using II-VI semiconductor materials in a light-electricity conversion device improves the excitation binding energy, which results in improved quantum efficiency. Also, hexagonal II-VI semiconductors are more resistant to the formation of dark spots than cubic ones under high excitation levels. That is, a low-symmetry structure such as the hexagonal structure (wurtzite structure) is beneficial for suppressing the propagation of defects in the light-electricity conversion device.

This document discloses light-electricity conversion devices using II-VI semiconductor materials. As used herein, the term "light-electricity conversion device" may also include "photovoltaic cell," "photovoltaic converter," "photovoltaic system," "solar cell," "solar converter," "solar cell system," and the like.

II-VI semiconductors having a wide-band gap show strong piezoelectric effects and spontaneous polarization, which degrade the quantum efficiency. Cladding or a barrier for the active layer may contain structures or material compositions which reduce strain, or a combination of piezoelectric and spontaneous polarization, which can be modified from the reports [S.-H. Park, D. Ahn, and J.-W. Kim, "Optical gain in InGaN/InGaAlN quantum well structures with zero internal field", Appl. Phys. Lett. 92, 171115, 2008; S.-H. Park and D. Ahn, "Internal field engineering in CdZnO/MgZnO quantum well structures", Appl. Phys. Lett. 94, 083507, 2009].

Figure 1:
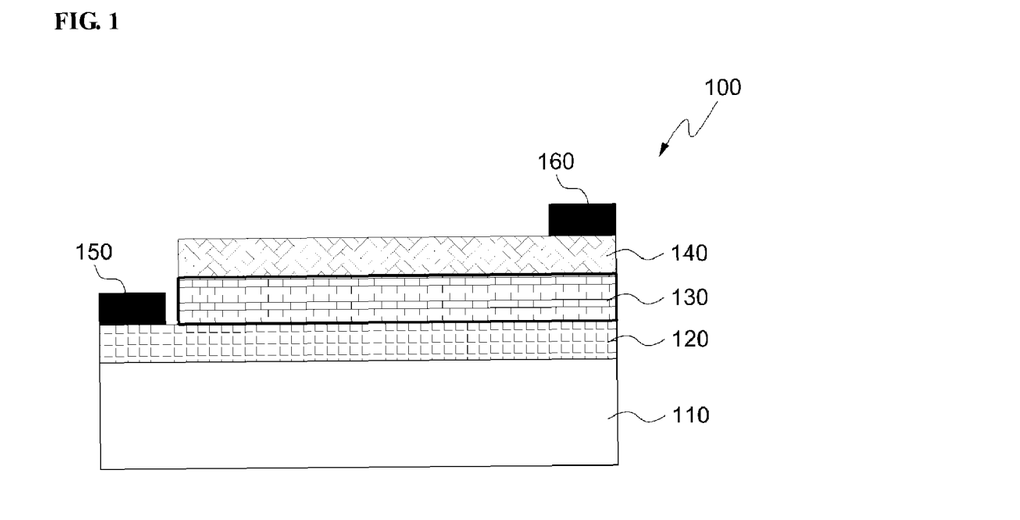
FIG. 1 shows a schematic of an illustrative embodiment of a light-electricity conversion device based on II-VI semiconductor materials.

FIG. 1 shows a schematic of an illustrative embodiment of a light-electricity conversion device 100 based on II-VI semiconductor materials. As depicted, the light-electricity conversion device 100 may include a substrate 110 and an n-type semiconductor layer 120, a light-absorbing layer 130, a p-type semiconductor layer 140, a first electrode 150 and a second electrode 160 disposed on the substrate 110. The light-absorbing layer 130 may be formed using a material selected from, for example, ZnS, $Cd_xZn_{1-x}S$ or $CdS_{1-x}Se_x$, where x is 0<x<1. Each of the n-type semiconductor layer 120 and the p-type semiconductor layer 140 may be formed using a material selected from, for example, MgZnS, MgCdZnS, MgCdSSe or ZnS.

Hereinafter, $Cd_xZn_{1-x}S$ (0<x<1) and $CdS_{1-x}Se_x$ (0<x<1) may be abbreviated CdZnS and CdSSe, respectively, which are also applied to production of other compound semiconductors.

For example, a composite material used for fabrication of a combined n-type semiconductor layer 120/light-absorbing layer 130/p-type semiconductor layer 140 may include MgZnS/ZnS/MgZnS, MgZnS/ZnS/MgCdZnS, MgCdZnS/ZnS/MgZnS, MgCdZnS/ZnS/MgCdZnS, MgZnS/CdZnS/MgZnS, MgZnS/CdZnS/MgCdZnS, MgCdZnS/CdZnS/MgZnS, MgCdZnS/CdZnS/MgCdZnS, MgZnS/CdZnS/MgZnS, MgZnS/CdZnS/MgCdSSe, MgCdSSe/CdZnS/MgZnS, MgCdSSe/CdZnS/MgCdSSe, MgZnS/CdSSe/MgZnS, MgZnS/CdSSe/MgCdSSe, MgCdSSe/CdSSe/MgZnS, MgCdSSe/CdSSe/MgCdSSe and/or ZnS/CdSSe/ZnS.

Referring to FIG. 1, the n-type semiconductor layer 120/light-absorbing layer 130/p-type semiconductor layer 140 are presented as one unit. However, a light-electricity conversion device according to another embodiment may have a multiple unit structure that includes the above composite materials laminated on a substrate.

As for such a multi-unit lamination structure, the band gap energy of the n-type semiconductor layer 120/light-absorbing layer 130/p-type semiconductor layer 140 unit may increase in the direction of the lamination of the units from the substrate. In some embodiments, the uppermost n-type semiconductor layer 120/light-absorbing layer 130/p-type semiconductor layer 140 unit may have the highest band gap energy.

Hereinafter, a detailed description will be given of a process for fabrication of the light-electricity conversion device 100.

As shown in FIG. 1, after preparing the substrate 110, the n-type semiconductor layer 120 may be formed on the substrate 110. Suitable materials for the substrate 110 include GaAs, Ge, Si or GaP, although the material used for the substrate 110 is not particularly limited thereto. In one embodiment, the substrate 110 includes GaAs.

The n-type semiconductor layer 120 may include a II-VI semiconductor compound such as, for example, MgZnS, MgCdZnS, MgCdSSe or ZnS. A doping material including V group elements such as, for example, antimony Sb, arsenic As, or phosphorus P may be used as a donor. However, the doping material is not particularly limited to the foregoing elements.

Using a compound semiconductor epitaxy apparatus, a II-VI semiconductor compound may be grown to a thickness of about 10 to about 600 Å on the substrate 110 so as to form the n-type semiconductor layer 120. However, the thickness is not particularly restricted to the above range.

The compound semiconductor epitaxy apparatus may employ any of a variety of disposition techniques, such as Molecular Beam Epitaxy (MBE), Plasma Enhanced Chemical Vapor Deposition (PECVD), Metal Organic Chemical Vapor Deposition (MOCVD), Metal Organic Molecular Beam Epitaxy (MOMBE), or a combination thereof, to grow and form the desired layers of the light-electricity conversion devices disclosed herein. However, the apparatus is not particularly limited to the aforementioned techniques.

Using the compound semiconductor epitaxy apparatus, the light-absorbing layer 130 may then be grown and formed on the n-type semiconductor layer 120. The light-absorbing layer 130 may include a II-VI semiconductor compound such as, for example, ZnS, $Cd_xZn_{1-x}S$, $CdS_{1-x}Se_x$, etc., where x is 0<x<1.

The thickness of the light-absorbing layer 130 is not particularly limited. However, the light-absorbing layer 130 may be thicker than the n-type semiconductor layer 120 or the p-type semiconductor layer 140, which is further described below. By way of example, in some embodiments, the light-absorbing layer 130 may be grown to a thickness of about 0.01 to about 3 μm. The thicknesses of each of the layers are not particularly limited to the aforementioned ranges, but, rather, may vary depending on conditions and/or properties of the layers, such as (light) absorptivity, absorbing spectrum range, etc.

The p-type semiconductor layer 140 may then be grown and formed on the light-absorbing layer 130. The material used for the p-type semiconductor layer 140 may be the same (i.e., a II-VI semiconductor compound such as, for example, MgZnS, MgCdZnS, MgCdSSe or ZnS) or different from that of the n-type semiconductor layer 120. A doping material including group III elements such as, for example, boron B, gallium Ga or indium In may be used as an acceptor. However, the doping material is not particularly limited to the foregoing elements.

As depicted in FIG. 1, the light-electricity conversion device 100 includes the p-type semiconductor layer 140 formed as the uppermost layer (or top layer). In other embodiments, the p-type semiconductor layer 140 may not be the uppermost layer but, rather, may be positioned as one of the lower layers. By way of example, the position of the p-type semiconductor layer 140 may be interchanged with the n-type semiconductor layer 120.

Referring again to the light-electricity conversion device 100, a photoresist mask may be formed on a portion of the top or exposed side of the p-type semiconductor layer 140. In embodiments where the p-type semiconductor layer 140 is not the uppermost layer, the photoresist mask may be formed on a portion of the top or exposed side of the uppermost layer. The photoresist mask may then be etched, along with a part of the laminated layers positioned above the n-type semiconductor layer 120, such as parts of the p-type semiconductor layer 140 and the light-absorbing layer 130, to expose a portion of the top surface of the n-type semiconductor layer 120. The first electrode 150 may then be fabricated by depositing a metal thin film, such as a film based on Al, Cu, Ag, etc., on at least a portion of the exposed surface of the n-type semiconductor layer 120 obtained as a result of the etching process. The second electrode 160 may then be fabricated by depositing another metal thin film, such as a film based on Al, Cu, Ag, etc., on at least a portion of the surface of the p-type semiconductor layer 140. The first electrode 150 and the second electrode 160 may be fabricated using any of a variety of conductive materials other than the aforementioned materials.

The first electrode 150 may be disposed at a different position than the site shown in FIG. 1, as long as the first electrode 150 is duly fixed on the n-type semiconductor layer 120. Likewise, the second electrode 160 may be disposed at a different position than the site shown in FIG. 1, as long as the second electrode 160 is duly fixed on the p-type semiconductor layer 140.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 2:
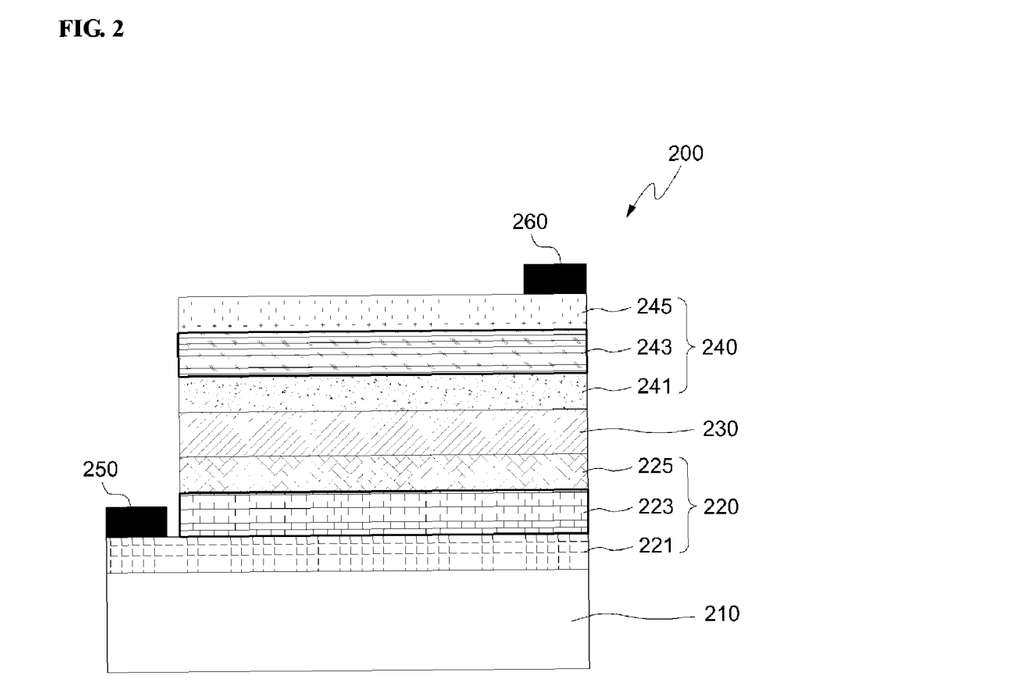
FIG. 2 shows a schematic of another illustrative embodiment of a light-electricity conversion device based on II-VI semiconductor materials.

FIG. 2 shows a schematic of another illustrative embodiment of a light-electricity conversion device 200 based on II-VI semiconductor materials. As depicted, the light-electricity conversion device 200 may include a substrate 210 and a bottom cell 220, a tunnel layer 230, a top cell 240, a first electrode 250 and a second electrode 260 disposed on the substrate 210.

The bottom cell 220 may have a structure formed by laminating a light-absorbing layer 223 and a p-type semiconductor layer 225 in this order on an n-type semiconductor layer 221. The top cell 240 may have a structure formed by laminating a light-absorbing layer 243 and a p-type semiconductor layer 245 in this order on another n-type semiconductor layer 241.

Hereinafter, a detailed description will be given of a process for fabrication of the light-electricity conversion device 200.

As shown in FIG. 2, after preparing the substrate 210, the n-type semiconductor layer 221 may be formed on the substrate 210. Suitable materials for the substrate 210 include GaAs, Ge, Si or GaP, although the material used for the substrate 210 is not particularly limited thereto. In one embodiment, the substrate 210 includes GaAs. Using GaAs as a substrate material, a thin film hetero-epitaxial structure may be obtained so as to attain enhanced power conversion efficiency and reduced cost for the light-electricity conversion device.

The n-type semiconductor layer 221 may include a II-VI semiconductor compound such as, for example, MgZnS, MgCdSSe or ZnS. Using a compound semiconductor epitaxy apparatus, a II-VI semiconductor compound may be grown to a thickness of about 10 to about 600 Å on the substrate 210 so as to form the n-type semiconductor layer 221.

The compound semiconductor epitaxy apparatus may be used to grow the light-absorbing layer 223. By way of example, in some embodiments, the light-absorbing layer 223 may be grown to a thickness of about 0.01 to about 3 µm on the n-type semiconductor layer 221. The light-absorbing layer 223 may include a II-VI semiconductor compound such as, for example, CdZnS or CdSSe.

Due to the formation of the aforementioned ternary CdZnS or CdSSe compound, the spectral response of the solar cell is expected to be extended to the high energy side of the solar spectrum, with respect to the ratio of each element in the ternary compound. For example, when $Cd_xZn_{1-x}S$ is used for the light-absorbing layer 223, the bottom cell 220 may have a band gap energy of $E_g=3.67-1.242x$, where x is $0<x<1$. Each cell may pass photons having lower energy than the band gap energy while absorbing photons having higher energy than the band gap energy. Accordingly, in this case, blue to deep-blue light may be absorbed.

Contrary to the aforementioned, when the light-absorbing layer 223 is formed using $CdS_{1-x}Se_x$, the bottom cell 220 may have a band gap energy of $E_g=2.482-0.75x$, where x is $0<x<1$. If x is 0.15, the band gap energy of the bottom cell 220 may be 2.37 eV, which corresponds to a wavelength of 520 nm. Therefore, the bottom cell 220 may absorb green to blue-green light. On the other hand, if x is 0.7, the band gap energy of the bottom cell 220 may be 1.957 eV, which corresponds to a wavelength of 630 nm. Therefore, the bottom cell 220 may absorb red light. Bottom cells 220 with different band gap energies may absorb light with different wavelengths corresponding to the band gap energies.

The p-type semiconductor layer 225 may be grown and formed on the light-absorbing layer 223. The p-type semiconductor may include a II-VI semiconductor compound such as, for example, MgZnS, MgCdSSe or ZnS.

The tunnel layer 230 may be grown and formed on the p-type semiconductor layer 225. The tunnel layer 230 may include a II-VI semiconductor compound such as, for example, MgZnS or ZnS. The tunnel layer 230 may serve as a passage through which electrons generated by photon absorption in the bottom cell 230 or the top cell 240 can migrate.

The top cell 240 may be formed on the tunnel layer 230 by a similar process as that used for the formation of the bottom cell 220 described above. The n-type semiconductor layer 241 and the p-type semiconductor layer 245 may include a II-VI semiconductor compound such as, for example, MgZnS or MgCdZnS, while the light-absorbing layer 243 may include a II-VI semiconductor compound such as, for example, ZnS or CdZnS.

Referring again to the light-electricity conversion device 200, a photoresist mask may be formed on a portion of the top or exposed side of the p-type semiconductor layer 245. In embodiments where the p-type semiconductor layer 245 is not the uppermost layer, the photoresist mask may be formed on a portion of the top or exposed side of the uppermost layer. The photoresist mask may then be etched, along with a part of the laminated layers positioned above the n-type semiconductor layer 221, such as parts of the p-type semiconductor layer 245, the light-absorbing layer 243, the n-type semiconductor layer 241, the tunnel layer 230, the p-type semiconductor layer 225 and the light-absorbing layer 223, to expose a portion of the top surface of the n-type semiconductor layer 221. The first electrode 250 may then be fabricated by depositing a metal thin film, such as a film based on Al, Cu, Ag, etc., on at least a portion of the exposed surface of the n-type semiconductor layer 221 obtained as a result of the etching process. The second electrode 260 may then be fabricated by depositing another metal thin film, such as a film based on Al, Cu, Ag, etc., on at least a portion of the surface of the p-type semiconductor layer 245.

The top cell 240 and the bottom cell 220 of the light-electricity conversion device 200 fabricated as above may absorb photons in different spectra.

Figure 3:
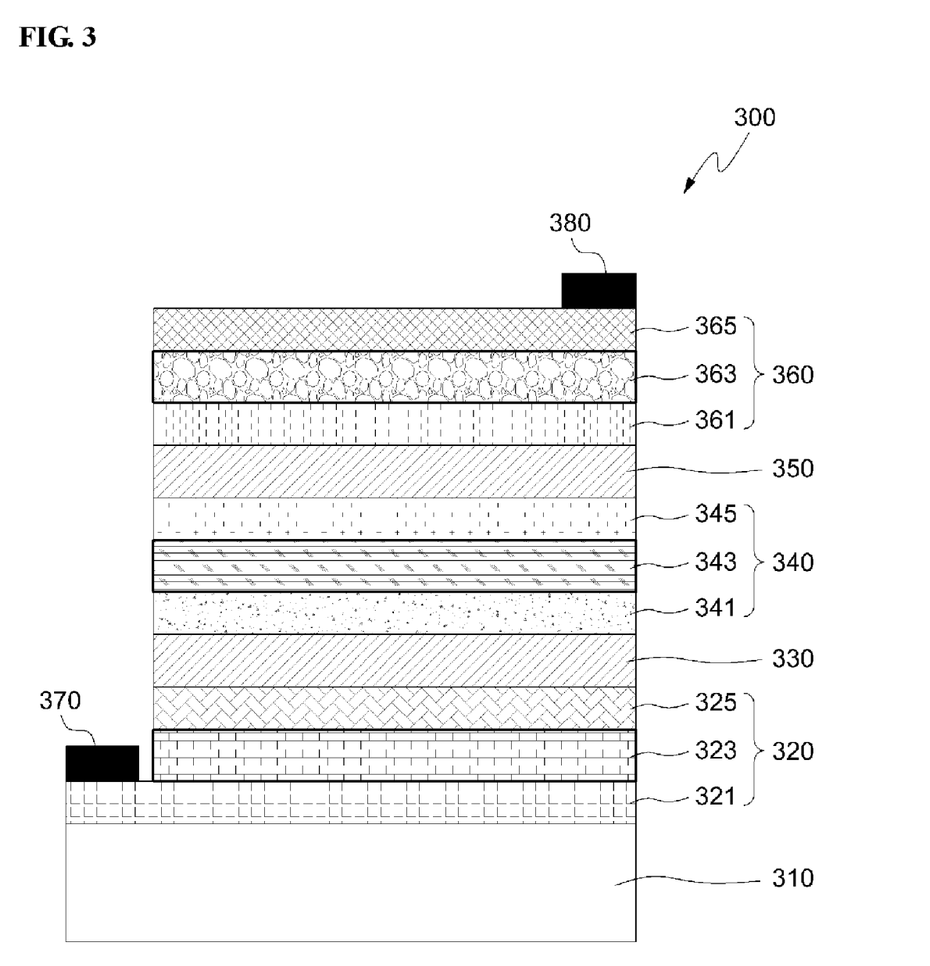
FIG. 3 shows a schematic of a further illustrative embodiment of a light-electricity conversion device based on II-VI semiconductor materials.

FIG. 3 shows a schematic of a further illustrative embodiment of a light-electricity conversion device 300 based on II-VI semiconductor materials. As depicted, the light-electricity conversion device 300 may include a substrate 310 and a bottom cell 320, a first tunnel layer 330, a middle cell 340, a second tunnel layer 350, a top cell 360, a first electrode 370 and a second electrode 380 disposed on a surface of the substrate 310.

The bottom cell 320, the middle cell 340 and the top cell 360 may have the same structure, each being formed by laminating a light-absorbing layer 323, 343 or 363 and a p-type semiconductor layer 325, 345 or 365 in this order on an n-type semiconductor layer 321, 341 or 361.

Hereinafter, a detailed description will be given of a process for fabrication of the light-electricity conversion device 300.

As shown in FIG. 3, after preparing the substrate 310, the n-type semiconductor layer 321 may be formed on the substrate 310. In one embodiment, the substrate 310 includes GaAs. The n-type semiconductor layer 321 may include a II-VI semiconductor compound such as, for example, ZnS.

Using a compound semiconductor epitaxy apparatus, a II-VI semiconductor compound may be grown to a thickness of about 10 to about 600 Å on the substrate 310 so as to form the n-type semiconductor layer 321. The compound semiconductor epitaxy apparatus may be used to grow the light-absorbing layer 323. By way of example, in some embodiments, the light-absorbing layer 323 may be grown to a thickness of about 0.01 to about 3 µm on the n-type semiconductor layer 321. The light-absorbing layer 323 may include a II-VI semiconductor compound such as, for example, CdSSe.

Due to formation of the aforementioned ternary CdSSe compound, the spectral response of the solar cell is expected to be extended to the high energy side of the solar spectrum, with respect to the ratio of each element in the ternary compound.

For example, when $Cd_xS_{1-x}Se_x$ is used for the light-absorbing layer 323, the bottom cell 320 may have a band gap energy of $E_g=2.482-0.75x$, where x is $0<x<1$. Bottom cells 320 with different band gap energies may absorb light with different wavelengths corresponding to the band gap energies.

The p-type semiconductor layer 325 may then be grown and formed on the light-absorbing layer 323. The p-type semiconductor may include a II-VI semiconductor compound such as, for example, ZnS.

The first tunnel layer 330 may then be grown and formed on the p-type semiconductor layer 325. The first tunnel layer 330 may include a II-VI semiconductor compound such as, for example, ZnS. The first tunnel layer 330 or the second tunnel layer 350 (discussed further below) may serve as a passage through which electrons generated by photon absorption in the bottom cell 320, the middle cell 340 or the top cell 360 can migrate.

Formation of the middle cell 340, the second tunnel layer 350 and the top cell 360 on the first tunnel layer 330 may be performed by a similar process as that used for the formation of the bottom cell 320 and the first tunnel layer 330 described above.

The n-type semiconductor layer 341 and the p-type semiconductor layer 345 in the middle cell 340 may include a II-VI semiconductor compound such as, for example, MgZnS or MgCdSSe, while the light-absorbing layer 343 of the middle cell 340 may include a II-VI semiconductor compound such as, for example, CdZnS or CdSSe. The second tunnel layer 350 may include a II-VI semiconductor compound such as, for example, MgZnS.

In addition, the n-type semiconductor layer 361 and the p-type semiconductor layer 365 in the top cell 360 may include a II-VI semiconductor compound such as, for example, MgZnS or MgCdZnS, while the light-absorbing layer 363 of the top cell 360 may include a II-VI semiconductor compound such as, for example, ZnS or CdZnS.

The laminated layers are subjected to etching to provide for the first electrode 370 and the second electrode 380. The first electrode 370 may be fabricated by depositing a metal thin film, such as a film based on Al, Cu, Ag, etc., on at least a portion of the exposed surface of the n-type semiconductor layer 321 obtained as a result of the etching process. The second electrode 380 may be fabricated by depositing another metal thin film, such as a film based on Al, Cu, Ag, etc., on at least a portion of the surface of the p-type semiconductor layer 365.

In the light-electricity conversion device 300 fabricated as above, the top cell 360 may absorb photons having a band gap energy of more than 3.67 eV, the middle cell 340 may absorb photons having a band gap energy in the range of about 2.482 to about 3.67 eV and the bottom cell 320 may absorb photons having a band gap energy of less than 2.482 eV.

Therefore, the respective layers, that is, the bottom cell 320, the middle cell 340 and the top cell 360, may have different hetero-structures such that these layers may absorb photons with different wavelengths, as shown in FIG. 3.

Due to the enhanced lattice matching of component crystals, the hetero-epitaxy of the bottom cell 320, the middle cell 340 and the top cell 360 can be realized. The cell constructions are based on the enhanced lattice matching of specific materials with desired energy gaps.

In one embodiment, the light-electricity conversion device may include additional structures including at least one of InGaN and AlGaInN compounds which reduce internal field effects by composition controlled barriers.

In one embodiment, the light-electricity conversion device may further include a buffer layer. Such a buffer layer may be formed using a material with a lattice constant similar to, or the same as, the lattice constant between adjacent layers and may solve the problem of lattice mismatch between adjacent layers. The buffer layer may be subjected to doping with a dopant, similar to the p-type semiconductor layer or the n-type semiconductor layer.

In one embodiment, the thicknesses of each of the layers may be set according to the (light) absorptivity of the layer (absorption cross section), with respect to a wavelength or energy range.

The illustrative embodiments disclosed herein illustrate a light-electricity conversion device having up to three cells. However, the number of cells is not particularly restricted and the light-electricity conversion device may have more than three (3) cells. In this case, the uppermost cell may have the greatest band gap energy while the lowermost cell may have the smallest band gap energy. Such a light-electricity conversion device may enable transmission of light to reach the lowermost layer, so as to efficiently absorb light over a wide range of the spectrum. Although the embodiments disclosed herein illustrate epitaxial growth of each cell on a substrate, the substrate may be lifted off and removed after completing fabrication of the cells.

The light-electricity conversion devices fabricated as described herein are able to cover a wide spectrum range.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B and C, etc." is used, in general such a construction is intended in the sense one having skill in the art would understand the convention (e.g., "a system having at least one of A, B and C" would include but not be limited to systems that have A alone, B alone, C alone, A and B together, A and C together, B and C together, and/or A, B and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells and so forth.

From the foregoing, it will be appreciated that various embodiments of the present disclosure have been described herein for purposes of illustration and that various modifications may be made without departing from the scope and spirit of the present disclosure. Accordingly, the various embodiments disclosed herein are not intended to be limiting, with the true scope and spirit being indicated by the following claims.

The invention claimed is:

1. A light-electricity conversion device comprising:
    a substrate; and
    a cell that absorbs radiation being disposed on a surface of the substrate, the cell comprising:
        an absorbing layer, the absorbing layer comprising $CdS_{1-x}Se_x$ with $0<x<1$,
        a p-type semiconductor layer disposed on a first surface of the absorbing layer; and
        an n-type semiconductor layer disposed on a second surface of the absorbing layer,
    wherein the device converts absorbed radiation to electricity.

2. The light-electricity conversion device according to claim 1, wherein the p-type semiconductor layer and n-type semiconductor layer comprise the same compound.

3. The light-electricity conversion device according to claim 1, wherein the p-type semiconductor layer and n-type semiconductor layer comprise at least one of MgZnS, MgCdZnS, MgCdSSe and ZnS.

4. The light-electricity conversion device according to claim 1, wherein the substrate comprises GaAs.

5. A light-electricity conversion device comprising:
    a substrate;
    a first cell disposed on a surface of the substrate, the first cell to absorb radiation having a first spectrum, the first cell comprising:
        a first absorbing layer, the first absorbing layer comprising $CdS_{1-x}Se_x$ with $0<x<1$,
        a first p-type semiconductor layer disposed on a first surface of the first absorbing layer; and
        a first n-type semiconductor layer disposed on a second surface of the first absorbing layer;
    a first tunnel layer disposed on a surface of the first cell; and
    a second cell disposed on a surface of the first tunnel layer, the second cell to absorb radiation having a second spectrum different from the first spectrum, the second cell comprising:
        a second absorbing layer,
        a second p-type semiconductor layer disposed on a first surface of the second absorbing layer; and
        a second n-type semiconductor layer disposed on a second surface of the second absorbing layer,
    wherein the first cell, the first tunnel layer and the second cell comprise a II-VI semiconductor compound and the device converts absorbed radiation to electricity.

6. The light-electricity conversion device according to claim 5, wherein the first tunnel layer comprises ZnS.

7. The light-electricity conversion device according to claim 5, wherein the absorbing layer of the second cell comprises $Cd_xZn_{1-x}S$ or $CdS_{1-x}Se_x$ with $0<x<1$.

8. The light-electricity conversion device according to claim 5, wherein the p-type semiconductor layer and the n-type semiconductor layer of the first cell and the second cell comprise the same compound.

9. The light-electricity conversion device according to claim 5, wherein the p-type semiconductor layer and the n-type semiconductor layer of the first cell comprise ZnS.

10. The light-electricity conversion device according to claim 5, wherein the p-type semiconductor layer and the n-type semiconductor layer of the second cell comprise MgZnS or MgCdSSe.

11. The light-electricity conversion device according to claim 5, wherein the device further comprises:
    a second tunnel layer disposed on a surface of the second cell; and
    a third cell disposed on a surface of the second tunnel layer to absorb radiation having a third spectrum, which is different from the first spectrum and the second spectrum,
    wherein the second tunnel layer and the third cell comprise a II-VI semiconductor compound.

12. The light-electricity conversion device according to claim 11, wherein the second tunnel layer comprises MgZnS.

13. The light-electricity conversion device according to claim 11, wherein the third cell comprises:
    a third absorbing layer,
    a third p-type semiconductor layer disposed on a first surface of the third absorbing layer; and
    a third n-type semiconductor layer disposed on a second surface of the third absorbing layer,
    wherein the absorbing layer of the third cell comprises a II-VI semiconductor compound.

14. The light-electricity conversion device according to claim 13, wherein the absorbing layer of the third cell comprises ZnS or $Cd_xZn_{1-x}S$ with $0<x<1$.

15. The light-electricity conversion device according to claim 13, wherein the p-type semiconductor layer and the n-type semiconductor layer of the third cell comprise the same compound.

16. The light-electricity conversion device according to claim 13, wherein the p-type semiconductor layer and the n-type semiconductor layer of the third cell comprise MgZnS or MgCdZnS.

17. The light-electricity conversion device according to claim 5, wherein the substrate comprises GaAs.

18. A light-electricity conversion device comprising:
a plurality of cells,
wherein each cell comprises an absorbing layer to absorb radiation, each absorbing layer comprising $CdS_{1-x}Se_x$ with $0<x<1$, a p-type semiconductor layer disposed on a first surface of the absorbing layer and an n-type semiconductor layer disposed on a second surface of the absorbing layer,
wherein the plurality of cells have different band gap energies from each other and the device converts absorbed radiation to electricity.

19. The light-electricity conversion device according to claim 18, wherein the band gap energy of the plurality of cells is in increasing order toward one face of the device to which radiation is to be received.

20. The light-electricity conversion device according to claim 18, wherein the device further comprises tunnel layers comprising a II-VI semiconductor compound disposed between the plurality of cells.

21. The light-electricity conversion device according to claim 18, wherein the device further comprises a substrate on which the plurality of cells are disposed.

22. The light-electricity conversion device according to claim 21, wherein the band gap energy of the plurality of cells is in increasing order toward the side opposite to the substrate.

23. The light-electricity conversion device according to claim 21, wherein the substrate comprises GaAs.

24. A light-electricity conversion device comprising:
a substrate;
a first cell disposed on a surface of the substrate, the first cell to absorb radiation having a first spectrum, the first cell comprising:
a first absorbing layer,
a first p-type semiconductor layer disposed on a first surface of the first absorbing layer; and
a first n-type semiconductor layer disposed on a second surface of the first absorbing layer;
a first tunnel layer disposed on a surface of the first cell; and
a second cell disposed on a surface of the first tunnel layer, the second cell to absorb radiation having a second spectrum different from the first spectrum, the second cell comprising:
a second absorbing layer, the second absorbing layer comprising $Cd_xZn_{1-x}S$ or $CdS_{1-x}Se_x$ with $0<x<1$,
a second p-type semiconductor layer disposed on a first surface of the second absorbing layer; and
a second n-type semiconductor layer disposed on a second surface of the second absorbing layer,
wherein the first cell, the first tunnel layer and the second cell comprise a II-VI semiconductor compound and the device converts absorbed radiation to electricity.

25. The light-electricity conversion device according to claim 24, wherein the first absorbing layer of the first cell comprises $CdS_{1-x}Se_x$ with $0<x<1$.

26. The light-electricity conversion device according to claim 24, wherein the p-type semiconductor layer and the n-type semiconductor layer of the first and second cell comprise the same compound.

27. The light-electricity conversion device according to claim 21, wherein the p-type semiconductor layer and the n-type semiconductor layer of the first cell comprise ZnS.

28. The light-electricity conversion device according to claim 24, wherein the p-type semiconductor layer and the n-type semiconductor layer of the second cell comprise MgZnS or MgCdSSe.

* * * * *

UNITED STATES PATENT AND TRADEMARK OFFICE
CERTIFICATE OF CORRECTION

PATENT NO. : 8,367,925 B2
APPLICATION NO. : 12/493800
DATED : February 5, 2013
INVENTOR(S) : Ahn It is certified that error appears in the above-identified patent and that said Letters Patent is hereby corrected as shown below:

Title Page 2, in Item (56), under "OTHER PUBLICATIONS", in Column 1, Line 2, delete "al" and insert -- al., --, therefor at each occurrence throughout the patent.

Title Page 2, in Item (56), under "OTHER PUBLICATIONS", in Column 1, Line 6, delete "reduced-desnsity-operator" and insert -- reduced-density-operator --, therefor.

Title Page 2, in Item (56), under "OTHER PUBLICATIONS", in Column 1, Line 10, delete "reduced-desnsity-operator" and insert -- reduced-density-operator --, therefor.

Title Page 2, in Item (56), under "OTHER PUBLICATIONS", in Column 1, Line 24, delete "GaN/AlGaN" and insert -- GaN/AlGaN --, therefor.

Title Page 2, in Item (56), under "OTHER PUBLICATIONS", in Column 2, Line 1, delete "AiGan/" and insert -- AlGaN/ --, therefor.

Title Page 2, in Item (56), under "OTHER PUBLICATIONS", in Column 2, Line 5, delete "superlatttices" and insert -- superlattices --, therefor.

Title Page 2, in Item (56), under "OTHER PUBLICATIONS", in Column 2, Line 17, delete ""AlGaN/" and insert -- "AlGaN/ --, therefor.

Title Page 2, in Item (56), under "OTHER PUBLICATIONS", in Column 2, Line 23, delete "InGaN/InGaAIN" and insert -- InGaN/InGaAlN --, therefor.

Title Page 2, in Item (56), under "OTHER PUBLICATIONS", in Column 2, Line 34, delete "GaN/AlGaN" and insert -- GaN/AlGaN --, therefor.

Title Page 3, in Item (56), under "OTHER PUBLICATIONS", in Column 1, Line 13, delete "Bulletin.," and insert -- Bulletin, --, therefor.

Signed and Sealed this
Eleventh Day of June, 2013

Teresa Stanek Rea
*Acting Director of the United States Patent and Trademark Office*

CERTIFICATE OF CORRECTION (continued)
U.S. Pat. No. 8,367,925 B2

Title Page 3, in Item (56), under "OTHER PUBLICATIONS", in Column 1, Line 15, delete "injection,", J.Appl." and insert -- injection," J. Appl. --, therefor.

Title Page 3, in Item (56), under "OTHER PUBLICATIONS", in Column 1, Line 59, delete "-R et al" and insert -- -R. et al., --, therefor.

Title Page 3, in Item (56), under "OTHER PUBLICATIONS", in Column 2, Line 31, delete "9783527408283" and insert -- 9783527408283, --, therefor.

Title Page 3, in Item (56), under "OTHER PUBLICATIONS", in Column 2, Line 36, delete "al," and insert -- al., --, therefor.

Title Page 3, in Item (56), under "OTHER PUBLICATIONS", in Column 2, Lines 46-47, delete "InSb/AlxIn1-xSb" and insert -- InSb/AlxIn1-xSb --, therefor.

Title Page 3, in Item (56), under "OTHER PUBLICATIONS", in Column 2, Line 68, delete "Vaccum," and insert -- Vacuum, --, therefor.

In the Specifications:

In Column 5, Line 44, delete "230" and insert -- 220 --, therefor.

In Column 6, Line 32, delete "Il-VI" and insert -- II-VI --, therefor.

In Column 9, Line 16, delete "thereof" and insert -- thereof. --, therefor.

In the Claims:

In Column 12, Line 27, in Claim 27, delete "21," and insert -- 24, --, therefor.